(12) United States Patent
Taguchi et al.

(10) Patent No.: US 9,991,576 B2
(45) Date of Patent: Jun. 5, 2018

(54) ELECTRONIC APPARATUS CASE

(71) Applicant: FUJITSU LIMITED, Kawasaki-shi, Kanagawa (JP)

(72) Inventors: Makoto Taguchi, Gyouda (JP);
Noritoshi Ogawa, Gyouda (JP);
Tomoaki Satou, Kawasaki (JP);
Hiroyuki Fujita, Kumagaya (JP);
Hokuto Kakizaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 141 days.

(21) Appl. No.: 15/075,026

(22) Filed: Mar. 18, 2016

(65) Prior Publication Data
US 2016/0286643 A1    Sep. 29, 2016

(30) Foreign Application Priority Data

Mar. 24, 2015  (JP) ................. 2015-061633

(51) Int. Cl.
| | |
|---|---|
| *H01P 1/207* | (2006.01) |
| *H01P 3/02* | (2006.01) |
| *H05K 1/11* | (2006.01) |
| *H05K 3/42* | (2006.01) |
| *H01P 5/107* | (2006.01) |

(52) U.S. Cl.
CPC ............... *H01P 1/207* (2013.01); *H01P 3/02* (2013.01); *H01P 5/107* (2013.01); *H05K 1/115* (2013.01); *H05K 3/42* (2013.01)

(58) Field of Classification Search
CPC . H01P 3/02; H01P 1/207; H01P 5/107; H05K 1/115; H05K 5/2017; H05K 3/42
USPC ......................... 333/185, 208, 212
See application file for complete search history.

(56) References Cited

U.S. PATENT DOCUMENTS

| | | | |
|---|---|---|---|
| 2003/0232603 A1 | 12/2003 | Tanaka et al. | |
| 2005/0200424 A1 | 9/2005 | Takeda et al. | |
| 2010/0321132 A1* | 12/2010 | Park ................. | H01P 1/127 333/186 |

FOREIGN PATENT DOCUMENTS

| | | |
|---|---|---|
| JP | H01-129901 U | 9/1989 |
| JP | 2003-289204 A | 10/2003 |
| JP | 2004-22587 A | 1/2004 |
| JP | 2005-260570 A | 9/2005 |
| JP | 2013-106114 A | 5/2013 |

* cited by examiner

Primary Examiner — Rakesh Patel
(74) Attorney, Agent, or Firm — Arent Fox LLP

(57) ABSTRACT

An electronic apparatus case including: a circuit board provided on a lower case, the circuit board having a plurality of signal lines in parallel, each specified area of the circuit board between each adjacent pair of the plurality of signal lines having a plurality of first through holes and a plurality of second through holes, the plurality of first and second through holes respectively being arranged in a first and a second lines at substantially equal interval of ⅛ or less of a wavelength of signals propagating in the plurality of signal lines, the first line and the second line being arranged in parallel, each center of each of the plurality of first through holes and each center of each of the plurality of second through holes being shifted with a gap in a direction of the first line and the second line.

8 Claims, 13 Drawing Sheets

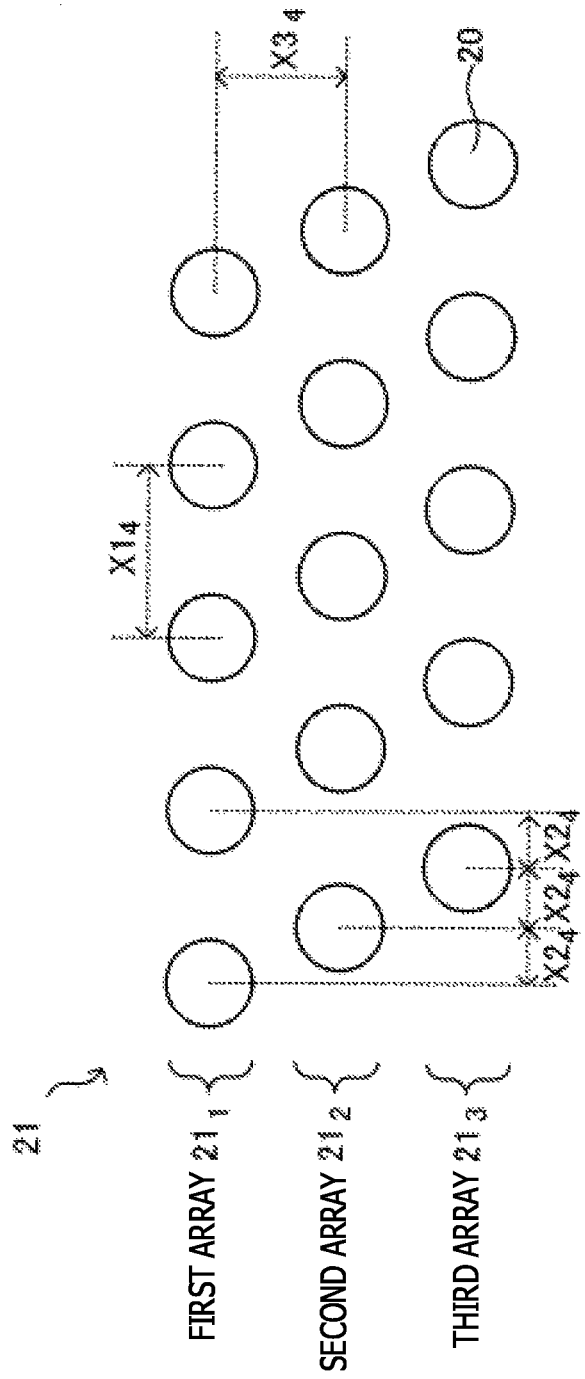

ELECTRONIC APPARATUS CASE

CROSS-REFERENCE TO RELATED APPLICATION

This application is based upon and claims the benefit of priority of the prior Japanese Patent Application No. 2015-061633, filed on Mar. 24, 2015, the entire contents of which are incorporated herein by reference.

FIELD

The embodiment discussed herein is related to an electronic apparatus case.

BACKGROUND

In the related art, there is a known technique related to a waveguide filter applied to a high frequency signal. As such a technique, there is a known technique of promoting miniaturization of a waveguide filter by bringing a circuit board close to the waveguide filter.

In addition, there is a known technique of adjusting a resonance frequency by installing an adjusting screw on a waveguide filter.

Japanese Laid-open Patent Publication No. 2003-289204, Japanese Laid-open Patent Publication No. 2005-260570, Japanese Laid-open Patent Publication No. 2013-106114, and Japanese Laid-open Patent Publication No. 2004-22587 are examples of related art.

SUMMARY

According to an aspect of the invention, an electronic apparatus case includes a lower case, a circuit board provided on the lower case, the circuit board having a plurality of signal lines in parallel, each specified area of the circuit board between each adjacent pair of the plurality of signal lines having a plurality of first through holes and a plurality of second through holes, the plurality of first through holes being arranged in a first line at substantially equal interval of ⅛ or less of a wavelength of signals propagating in the plurality of signal lines, the plurality of second through holes being arranged in a second line at the substantially equal interval of ⅛ or less of the wavelength of signals propagating in the plurality of signal lines, the first line and the second line being arranged in parallel, each center of each of the plurality of first through holes and each center of each of the plurality of second through holes being shifted with a gap in a direction of the first line and the second line, a lid provided over the circuit board so as to substantially entirely cover the circuit board, and an inner frame provided between the circuit board and the lid, the inner frame and the circuit board and the lid forming a plurality of separated spaces that respectively surround the plurality of signal lines.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a view that illustrates an example of a case in which there are three lines of through holes according to the embodiment;

DESCRIPTION OF EMBODIMENT

There is a case where, if the circuit board and the waveguide filter are integrated, the leak signal is generated, and, by using the leak signal propagated through the circuit board, the character of the original filter may not be obtained.

One aspect of the present embodiment has the object of suppressing the signal propagated through the circuit board.

Hereinafter, the embodiment for implementing the disclosed technique will be described with reference to the drawings.

Figure 1:
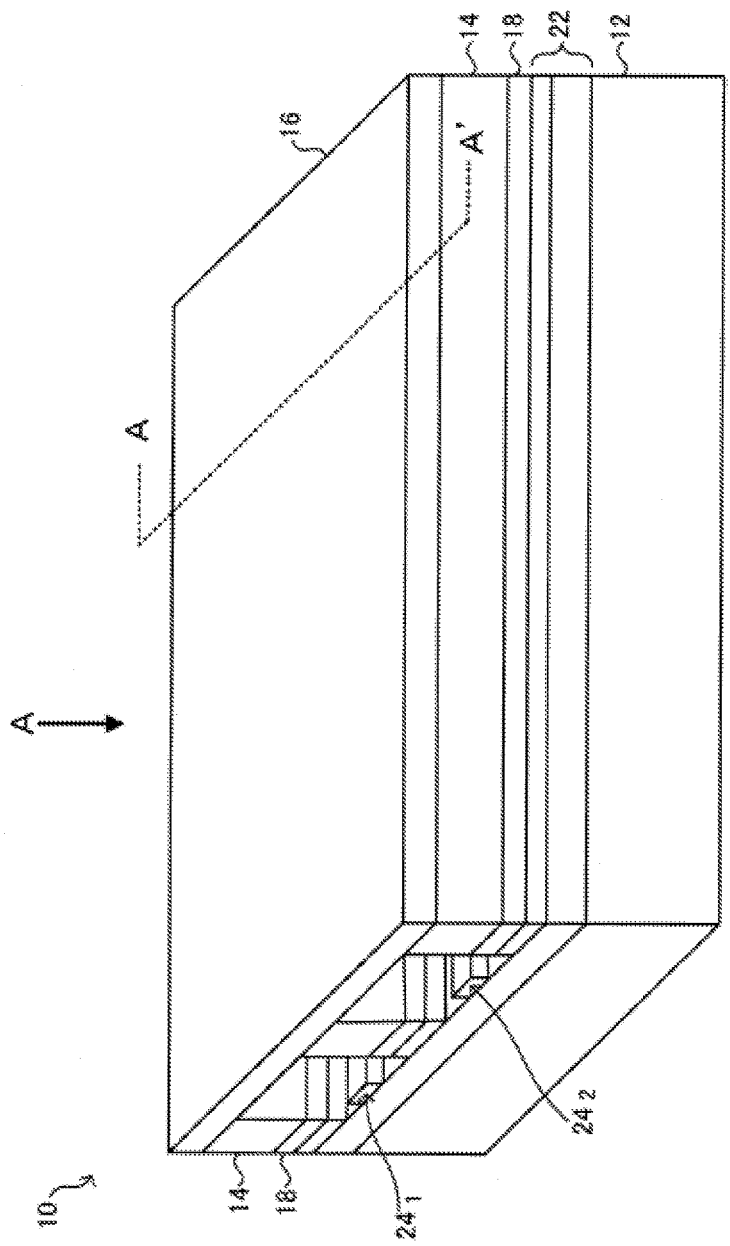
FIG. 1 is a perspective view of an electronic apparatus case according to an embodiment.
Figure 2A:
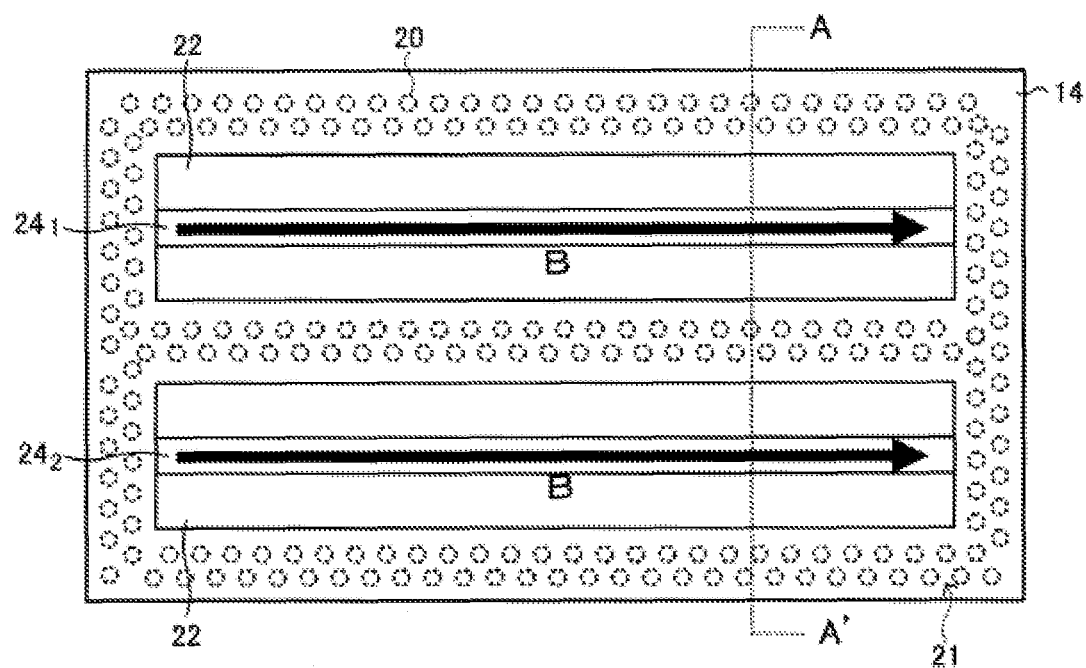
FIG. 2A is a plan view of the electronic apparatus case illustrated in FIG. 1 seen from an arrow A direction.

The configuration of an electronic apparatus case 10 of the embodiment will be described with reference to FIGS. 1 to 2B. FIG. 1 is a perspective view of an electronic apparatus case according to the embodiment. FIG. 2A is a plan view of the electronic apparatus case 10 illustrated in FIG. 1 seen from an arrow A direction. Meanwhile, in FIG. 2A, the state where the lid is removed is illustrated. In addition, in this state, practically, a through hole 20 may not be seen. However, for the sake of convenience, the through hole 20 is illustrated by a dotted line. Moreover, FIG. 2B is a cross-sectional view of the electronic apparatus case 10 taken along line A-A' in FIG. 1 and FIG. 2A.

Figure 2B:
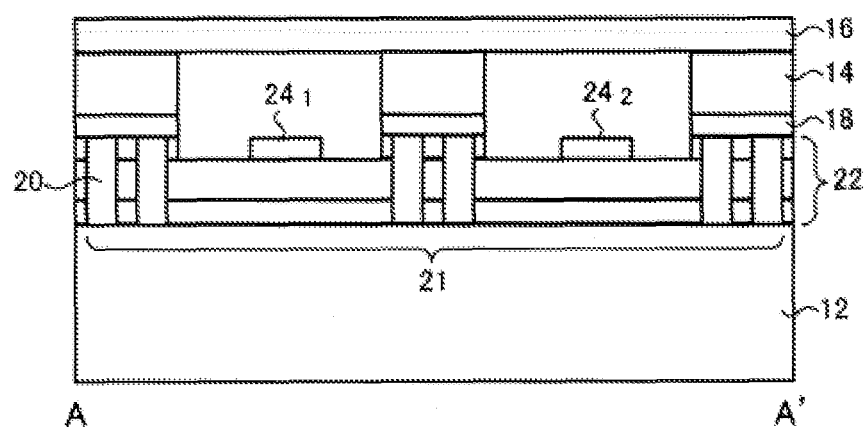
FIG. 2B is a cross-sectional view of the electronic apparatus case taken along line A-A' in FIG. 1 and FIG. 2A.

As illustrated in FIGS. 1 to 2B, the electronic apparatus case 10 according to the embodiment includes a lower case 12, an inner frame 14, a lid 16, a gasket 18, and a plurality of through holes 20 (a through hole group 21). In addition, as illustrated in FIGS. 1 to 2B, the electronic apparatus case 10 according to the embodiment pinches the circuit board 22 by each of the metal lower case 12, the inner frame 14, and the lid 16. Meanwhile, in the embodiment, the circuit board 22 corresponds to an example of a circuit board of the disclosed technique. On the lower case 12, the circuit board 22 is provided. At the circuit board 22, two signal lines $24_1$ and $24_2$ for transmitting a signal to an arrow B direction are formed as a wiring pattern. Hereinafter, a signal transmitted by the electronic apparatus case 10 will be referred to as a "transmission signal", and a signal (electromagnetic wave) leaked from the transmission signal will be referred to as "leak signal".

The inner frame 14 pinches the circuit board 22 through the gasket 18 that has conductivity so as to enclose a path of the transmission signal passing through (hereinafter referred to as a "transmission path"). The lid 16 is provided on the inner frame 14 so as to cover the space formed by the lower case 12 (circuit board 22) and the inner frame 14.

Figure 3A:
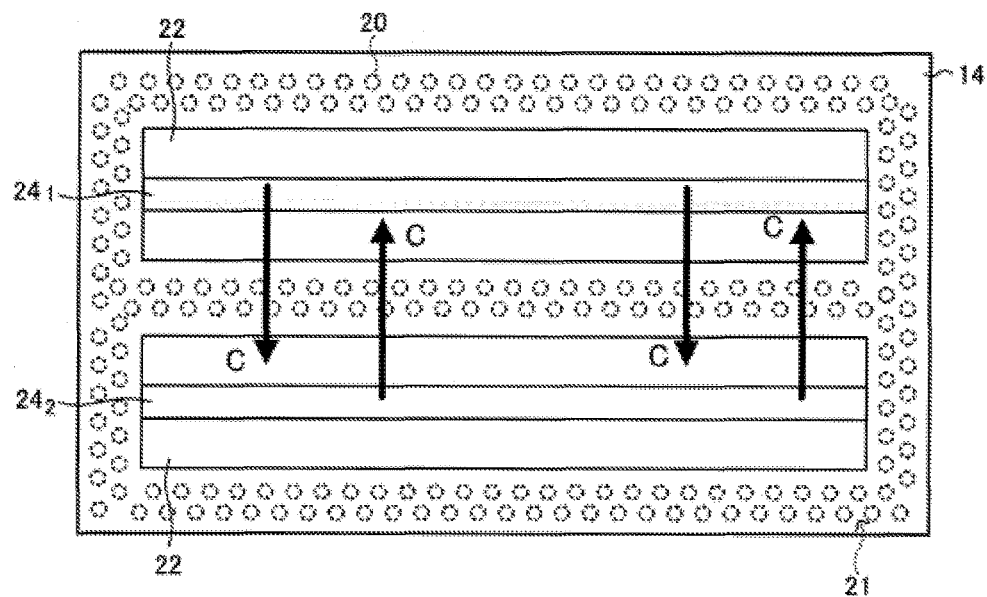
FIGS. 3A and 3B are diagrams that illustrate a function of reducing the propagation of leak signal in the electronic apparatus case according to the embodiment.
Figure 3B:
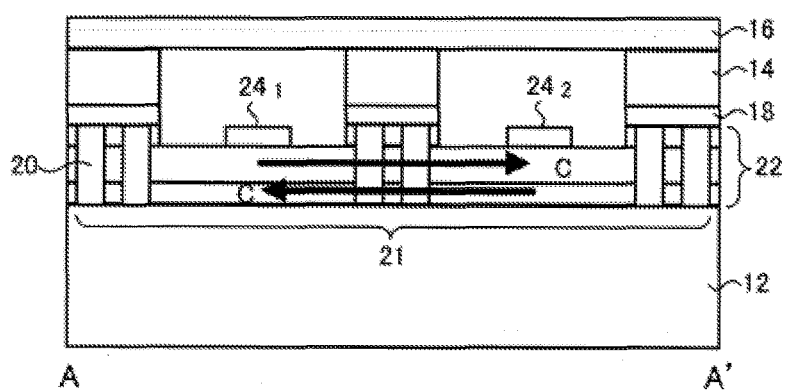

The through hole group 21 is provided at the circuit board 22 under the inner frame 14, and has a function of blocking the leak signal propagated through the circuit board 22. Specifically, the through hole group 21 has a function of reducing the propagation of the leak signal illustrated in FIGS. 3A and 3B by an arrow C.

Figure 4:
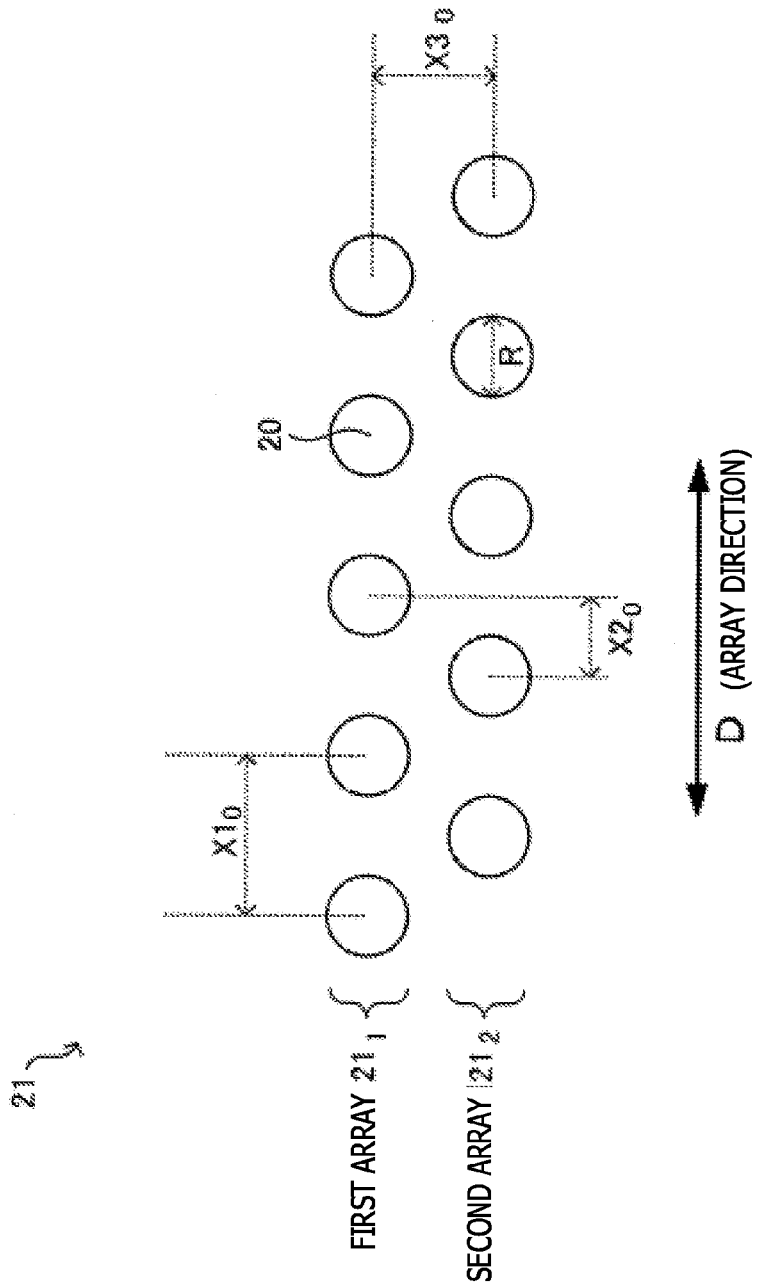
FIG. 4 is a view that illustrates an array of through holes according to the embodiment.

An array of the through holes 20 according to the embodiment will be described in detail. FIG. 4 is a view for describing the array of the through holes 20 according to the embodiment. As illustrated in FIGS. 2A to 4, the through holes 20 according to the embodiment are arranged in two lines so as to cover the transmission path below the inner frame 14. For this reason, the through hole group 21 includes, as illustrated in FIG. 4, a first array $21_1$ and a second array $21_2$. Meanwhile, a direction illustrated by an arrow D in FIG. 4 corresponds to an example of an array direction of the disclosed technique.

In the electronic apparatus case 10 according to the embodiment, if a interval $X1_0$ between the centers of the through holes 20 in each array of the through hole group 21 ($21_1$ and $21_2$) is ¼ or shorter than the wavelength of the transmission signal, the electronic apparatus case 10 is capable of blocking the used frequency. However, in the electronic apparatus case 10 according to the embodiment, in order to block the wavelength twice as long, the interval $X1_0$ between the centers of the through holes 20 in each array of the through hole group 21 (the first array $21_1$ and the second array $21_2$) is ⅛ or shorter than the wavelength of the transmission signal.

For example, in the case where the frequency is 18 GHz, the wavelength compaction ratio is 0.67, and the wavelength is 11.2 mm, it is preferable that the interval $X1_0$ between the centers of the through holes 20 is 1.4 (11.2/8) mm or less.

In addition, in the electronic apparatus case 10 according to the embodiment, in order to block the leak signal of the high frequency (shorter wavelength) rather than the used frequency, in the first array $21_1$ and the second array $21_2$, the gaps between the centers of the through holes 20 are shifted to be arranged. In the embodiment, as a specific example, a shift $X2_0$ of the gaps between the centers is ½ of the interval $X1_0$. Meanwhile, the shift $X2_0$ is not limited to the embodiment. If the through holes 20 in one array are arranged between the through holes 20 in the other array, and thereby the interval between the through holes 20 is filled, it is possible to block the leak signal of the high frequency better than in the case where the array of the through holes 20 is formed of one line.

In addition, an interval $X3_0$ between the first array $21_1$ and the second array $21_2$ is not specifically limited. However, it is preferable that the interval $X3_0$ is as narrow as possible from the perspective of blocking the leak signal.

In addition, a diameter R of the through hole 20 affects the resonance frequency. If the diameter R is longer, the resonance frequency is higher. If the diameter R reaches a certain length, the resonance frequency is fixed. However, the diameter R of the through hole 20 is limited by manufacturing problems or the like by the size of the electronic apparatus case 10 or the like. Specifically, if the electronic apparatus case 10 or a product including the entire board on which the electronic apparatus case 10 is mounted is miniaturized, such limitation becomes severe. For this reason, it is preferable that the diameter R of the through hole 20 is determined from the point where the best miniaturization of the product and the resonance frequency can be obtained.

Figure 5A:
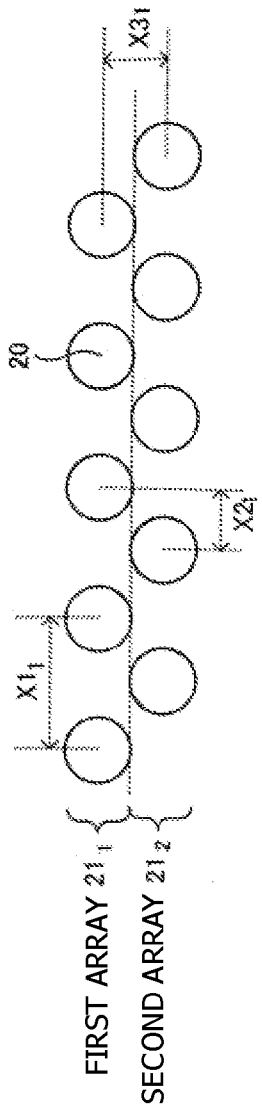
FIGS. 5A, 5B, and 5C are views that illustrate other examples of the arrangement of through holes according to the embodiment.
Figure 5B:
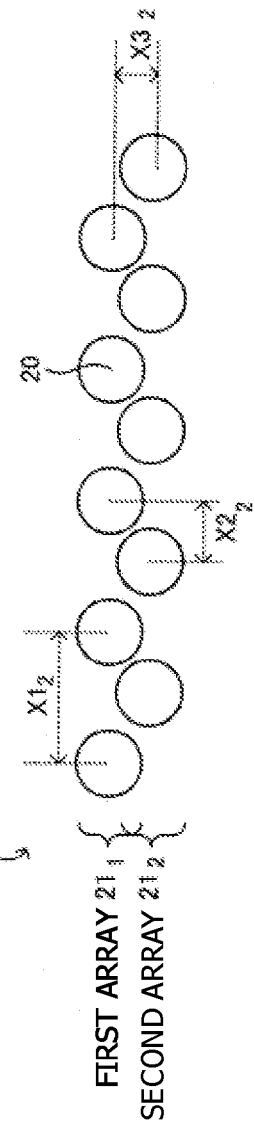
Figure 5C:
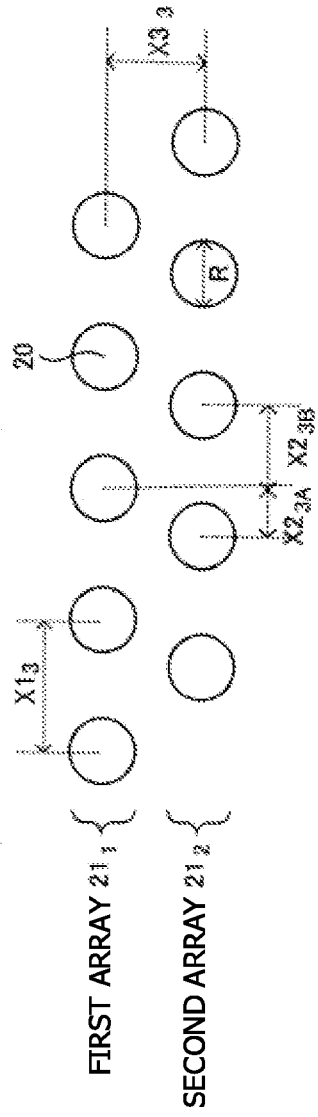

Meanwhile, the arrangement of the through hole 20 is not limited to the arrangement illustrated in FIG. 4, if the interval between the centers for each array of the through holes 20 are ⅛ wavelengths or less. FIGS. 5A, 5B, and 5C are views that illustrate other examples of the arrangement of the through holes 20. FIG. 5A illustrates a case where the through holes 20 are arranged so that the interval between the first array $21_1$ and the second array $21_2$ is not generated. In this case, an interval $X3_1$ between the arrays of the through holes 20 is narrower than the interval $X3_0$ ($X3_1 < X3_0$).

In addition, FIG. 5B illustrates a case where the through holes 20 in the second array $21_2$ are arranged between the through holes 20 in the first array $21_1$. In this case, an interval $X3_2$ between the arrays of the through holes 20 is narrower than the intervals $X3_0$ and $X3_1$ ($X3_2 < X3_1 < X3_0$).

In addition, FIG. 5C illustrates a case where there is a difference between the shift of the through holes 20 in the first array $21_1$ and the shift of the through holes 20 in the second array $21_2$. In this case, a shift $X2_{3A}$ and a shift $X2_{3B}$ of the gaps between the centers differ from each other ($X2_{3A} \neq X2_{3B}$). Meanwhile, also in this case, since the interval $X1_3$ between the through holes 20 in the first array $21_1$ is filled by the second array $21_2$, the leak signal propagated through the circuit board 22 is blocked, compared to the case where the array of the through holes 20 is formed of one line.

Moreover, the arrays of the through holes 20 are not limited to being of two lines, and may be of three or more lines. FIG. 6 is a view that illustrates an example of a case in which there are three lines of the through holes 20. In the case illustrated in FIG. 6, three lines of the first array $21_1$, the second array $21_2$, and a third array $21_3$ are provided. Also in the case illustrated in FIG. 6, it is needless to mention that the interval $X1_4$ between the centers is ⅛ wavelength or less as the interval $X1_0$ between the centers. In an example illustrated in FIG. 6, a shift $X2_4$ is ⅓ of an interval $X1_4$ between the centers ($3X2_4 = X1_4$). Meanwhile, also in the case where the arrays of the through holes 20 are formed of three lines or more, it is needless to mention that the through holes 20 may be arranged as in FIGS. 5A to 5C.

In the electronic apparatus case 10 according to the embodiment, in this manner, the circuit board 22 is interposed between the lower case 12, the inner frame 14, and the lid 16, and the through holes 20 are arranged at the circuit board 22 in the lower portion of the inner frame 14, and thereby a pseudo blocking structure is formed. In addition, the first array $21_1$ and the second array $21_2$, in which the through holes 20 are arranged so that the interval $X1$ between the centers is ⅛ or less than the wavelength, are provided so that the centers of the through holes 20 included in each array are shifted in a wiring direction.

In this manner, the interval X1 between the centers of the through holes 20 is ⅛ or less than the wavelength, and thereby it is possible to block the leak signal up to twice the transmission signal. In addition, the first array 21₁ and the second array 21₂ are shifted to be arranged, and thereby it is also possible to block the leak signal of higher frequency (shorter wavelength).

Moreover, in the electronic apparatus case 10 according to the embodiment, the circuit board 22 provided on the lower case 12 is interposed between the inner frame 14 and the lower case 12 through the gasket 18. When the circuit board 22 is interposed between the inner frame 14 and the lower case 12, there is a concern that a gap is generated by surface contact, and thereby electromagnetic wave leakage occurs. However, the circuit board 22 is interposed therebetween through the gasket 18, and thereby it is possible to promote the enforcement of the blocking against the leak signal by suppressing the electromagnetic wave leakage.

Therefore, the electronic apparatus case 10 according to the embodiment is capable of suppressing a signal propagated through the circuit board 22 to reduce radio-frequency interference. In addition, the electronic apparatus case 10 is capable of reducing radio-frequency interference due to a gap between the circuit board 22 and the inner frame 14.

Figure 7:
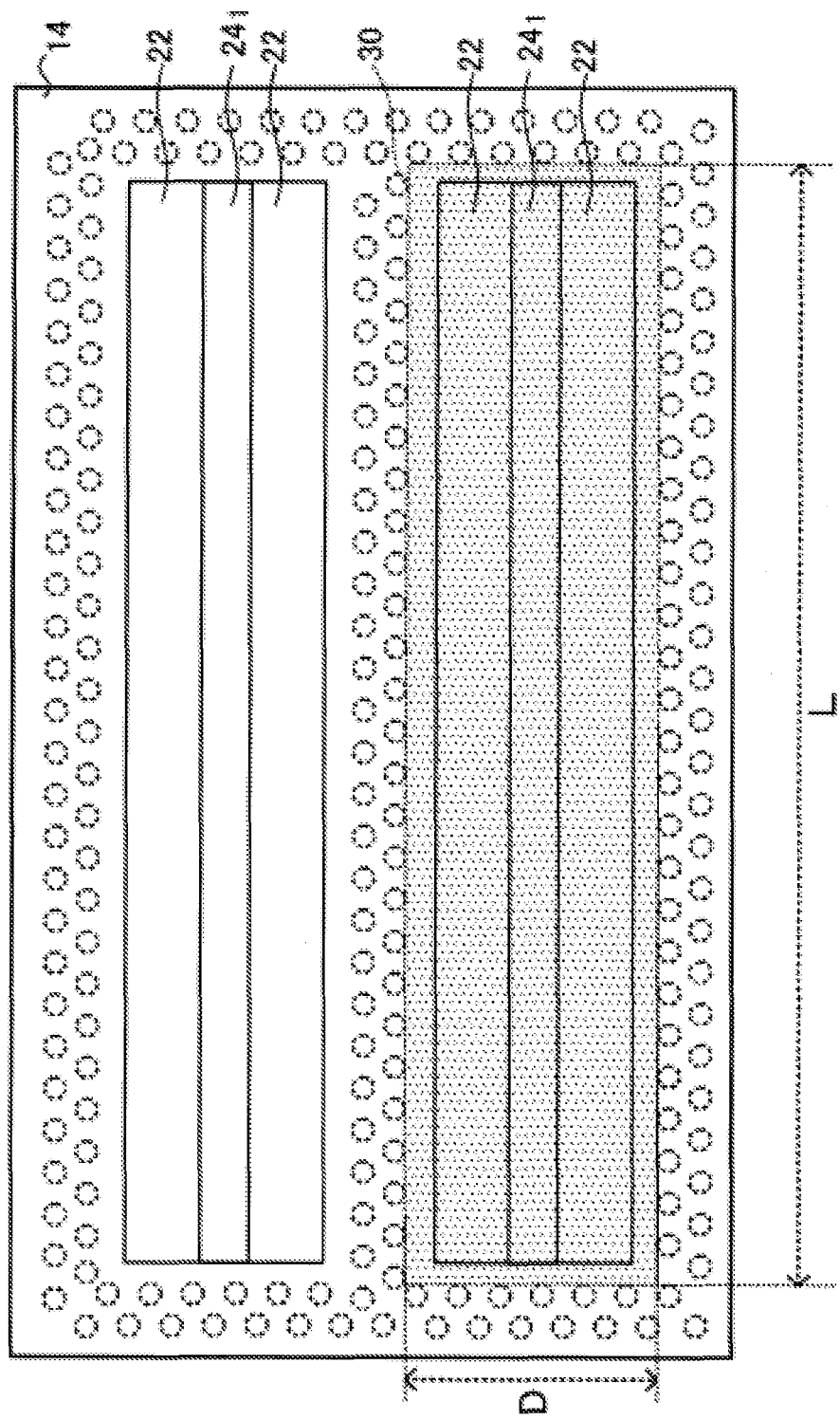
FIG. 7 is a view that illustrates a resonance frequency in a circuit board according to the embodiment.

Meanwhile, in the electronic apparatus case 10 according to the embodiment, the resonance frequency propagated through the circuit board 22 (specifically, through the circuit board 22 in an area corresponding to the transmission path) can be determined as follows. FIG. 7 is a view that illustrates a resonance frequency in the circuit board 22. As illustrated in FIG. 7, the resonance frequency of a signal that corresponds to the transmission path and that is propagated in an area 30 inside the circuit board 22 surrounded by the through holes 20 is determined according to a length L and an interval D. The length L is the length between the facing arrays of the through holes 20 provided at the input side and the output side of the transmission signal. The interval D is the interval between the facing arrays of the through holes 20 through the transmission path (signal line 24₁).

Since the area 30 inside the circuit board 22 functions as a resonator, the resonance frequency is determined by the length L and the interval D. If the height of the area 30 (interval between the circuit board 22 and the lid 16) is K, the resonance frequency on a TEmnl mode is obtained by the following equation (1).

$$\text{Resonance frequency } f = \text{light speed}/2 \times \sqrt{(m/D)^2 + (n/K)^2 + (l/L)^2} \quad (1)$$

Specifically, the resonance frequency in the case where the length L is 10 mm and the interval D is 1.64 mm will be described. If the wavelength compaction ratio according to the circuit board 22 is 0.67, the length L of as the length of a free space is 14.93 mm (10/0.67), and the interval D is 2.45 mm (1.64/0.67).

Therefore, the resonance frequency in the area 30 is 62.04 GHz on a TE101 mode, and 64.44 GHz on a TE102 mode.

For this reason, in the electronic apparatus case 10, by changing any of the length L or the interval D, it is possible to determine the resonance frequency propagated through the circuit board 22 (area 30).

Hereinafter, examples of the electronic apparatus case 10 of the embodiment will be described.

EXAMPLE 1

In Example 1, the electronic apparatus case 10 in which the lower case 12 has a filtering function will be described. That is, in the electronic apparatus case 10 according to Example 1, the circuit board 22 and a filter are integrated with each other.

Figure 8:
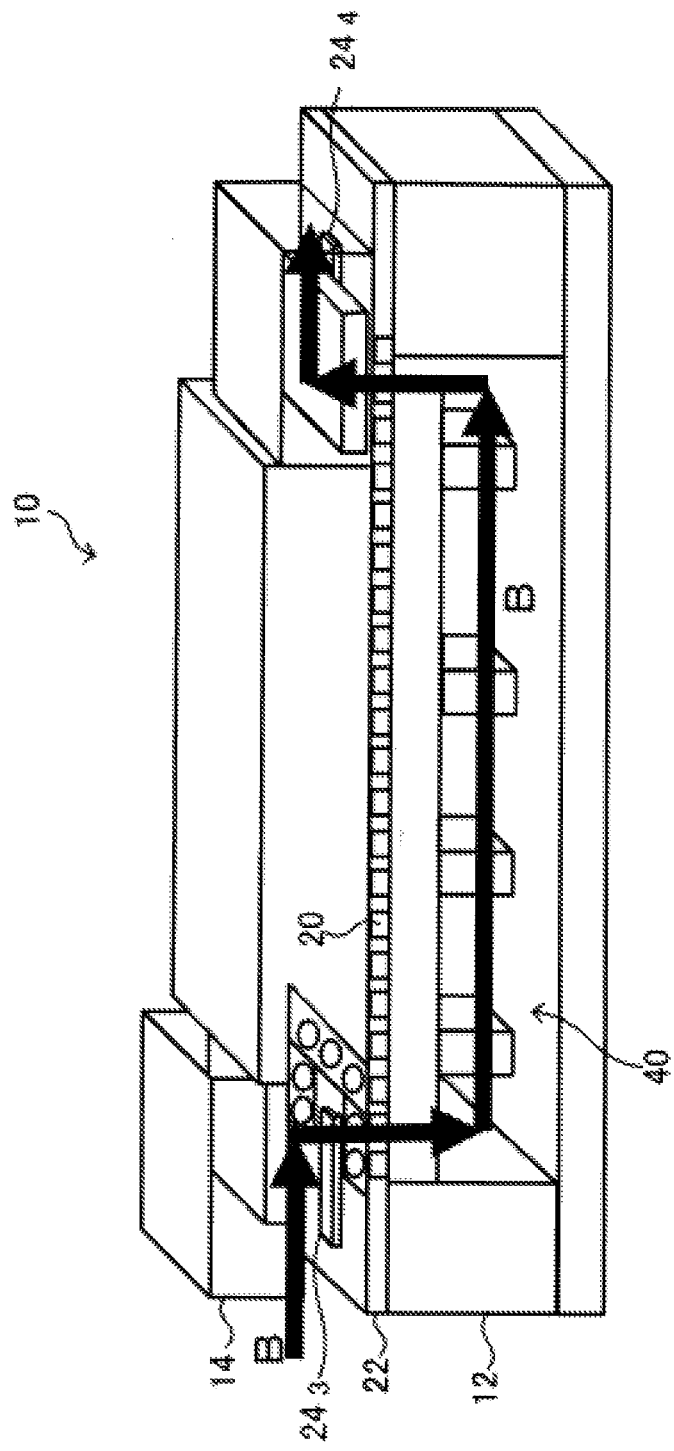
FIG. 8 is a view that illustrates a flowing direction of a transmission signal (transmission path) inside the electronic apparatus case in the case where a lower case according to Example 1 has a filtering function.

FIG. 8 is a view that illustrates a flowing direction of the transmission signal (transmission path) inside the electronic apparatus case 10 in the case where the lower case 12 has a filtering function. Since there is a cavity inside the lower case 12, the lower case 12 is provided with the filter 40 and operates as a waveguide that has a filtering function.

In the electronic apparatus case 10 according to this example, the transmission signal flows as the arrow B illustrated in FIG. 8. The transmission signal input by a signal line 24₃ is pulled out from a board and guided from an input section 47 to the filter 40 by a converting section not illustrated. The transmission signal that has passed through the filter 40 of the lower case 12 is converted again by the converting section not illustrated, is pulled out from an output section 48, and is output to the outside of the electronic apparatus case 10 by a signal line 24₄.

Figure 9:
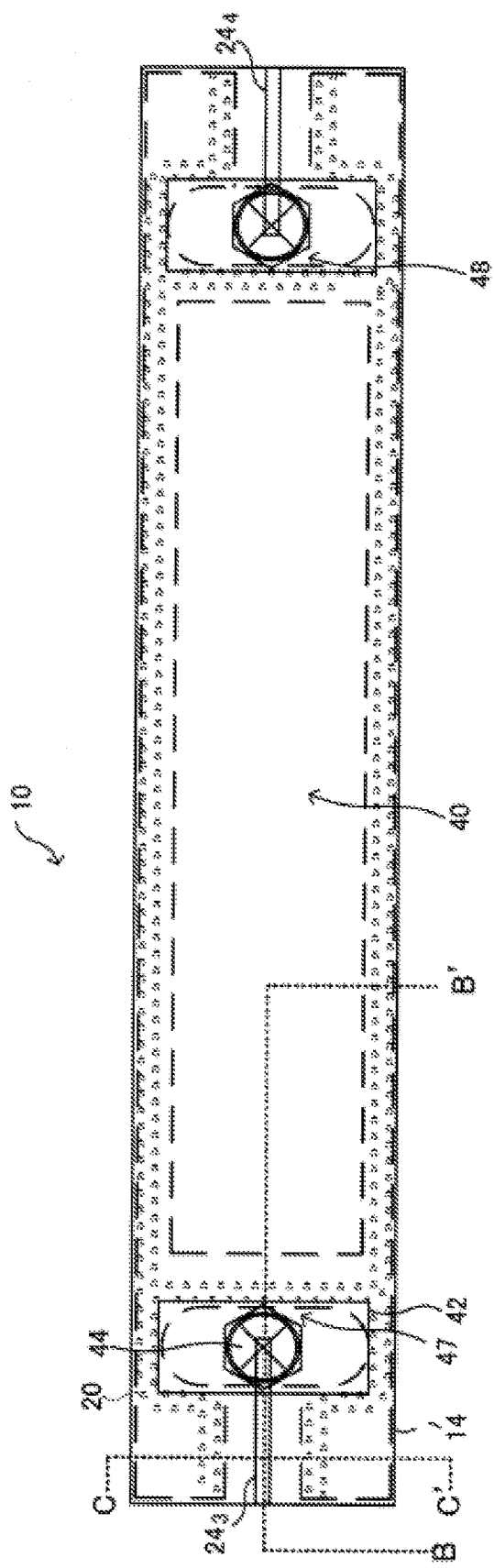
FIG. 9 is a plan view of the electronic apparatus case according to Example 1 seen from a lid side.
Figure 10A:
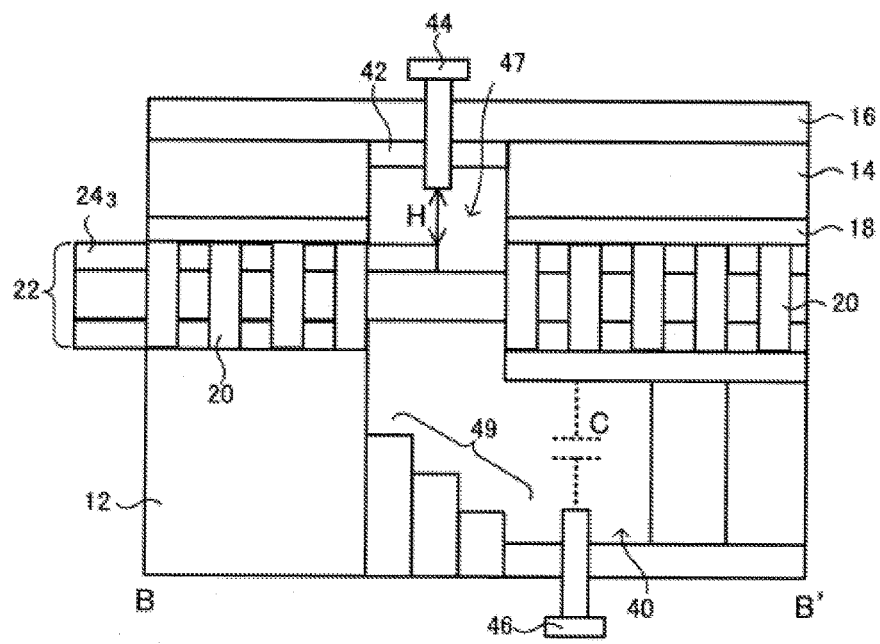
FIG. 10A is a cross-sectional view of the electronic apparatus case taken along line B-B' in FIG. 9.
Figure 10B:
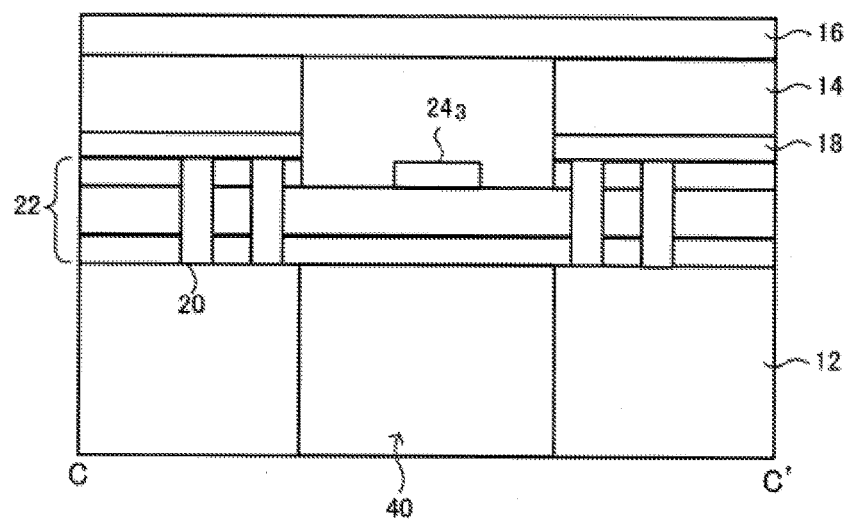
FIG. 10B is a cross-sectional view of the electronic apparatus case taken along line C-C' in FIG. 9.

FIG. 9 is a plan view of the electronic apparatus case 10 according to this example seen from the lid 16 side. Meanwhile, in FIG. 9, for the sake of convenience of description, each configuration provided in an area corresponding to the lower side of the lid 16 is illustrated by a dotted line. Moreover, FIG. 10A is a cross-sectional view of the electronic apparatus case 10 taken along line B-B' in FIG. 9. Furthermore, FIG. 10B is a cross-sectional view of the electronic apparatus case 10 taken along line C-C' in FIG. 9.

The configuration of the lower case 12, the inner frame 14, the lid 16, the through hole 20, and the circuit board 22 in the electronic apparatus case 10 according to this example is as described above.

In the electronic apparatus case 10 according to this example, in a ceiling portion of the filter 40 of the lower case 12 (a portion where the circuit board 22 is provided), an opening portion is provided in an area corresponding to the input section 47 and the output section 48 of the transmission signal. Hereinafter, the configuration of the input section 47 will be described. The configuration of the input section 47 is the same as the configuration of the output section 48.

In a portion of the lid 16 corresponding to the input section 47, a metal short board 42 is provided. In the input section 47, height H from the circuit board 22 to the short board 42 is shortened to ¼ wavelength of the transmission signal. In the electronic apparatus case 10, by adjusting the height H from the circuit board 22 using the adjusting screw 44 for impedance matching, it is possible to perform band adjustment while adjusting impedance. Meanwhile, if the height H is adjusted to be longer, the frequency band becomes narrower, and the resonance frequency becomes higher. On the contrary, if the height H is adjusted to be shorter, the frequency band becomes wider, and the resonance frequency becomes lower. Meanwhile, the short board 42 and the adjusting screw 44 are an example of a first adjusting section of the disclosed technique, and an adjusting screw 46 is an example of a second adjusting section of the disclosed technique.

In addition, at a corner corresponding to the input section 47 of the filter 40, as a structure for impedance matching, a structure 49 is provided in a stair shape which becomes gradually lower toward the inside of the filter 40. The stair-shaped structure 49 is an example of an impedance matching section of the disclosed technique.

Moreover, in the electronic apparatus case 10 according to this example, the adjusting screw 46 for matching is provided, and it is possible to change the interval between the adjusting screw 46 for matching and the ceiling portion of the filter 40 of the lower case 12 by the adjusting screw 46 for matching. Thereby, it is possible to change a capacity component C (capacity component C illustrated in FIG. 10A by a dotted line) between the adjusting screw 46 for matching and the ceiling portion of the filter 40 of the lower case 12. For this reason, in the electronic apparatus case 10 according to this example, it is possible to use the filter 40 in broadband.

In this manner, in the electronic apparatus case 10 according to this example, since it is possible to adjust the frequency band, even in a case where the actual band of the electronic apparatus case 10 (resonance frequency) is different from the designed value, it is possible to perform adjustment. In addition, in the electronic apparatus case 10 according to this example, it is possible to use the filter 40 in broadband.

EXAMPLE 2

In Example 2, as in the electronic apparatus case 10 according to Example 1, the electronic apparatus case 10 in which the circuit board 22 and the filter are integrated and a high power amplifier is provided in the circuit board 22 will be described.

Figure 11A:
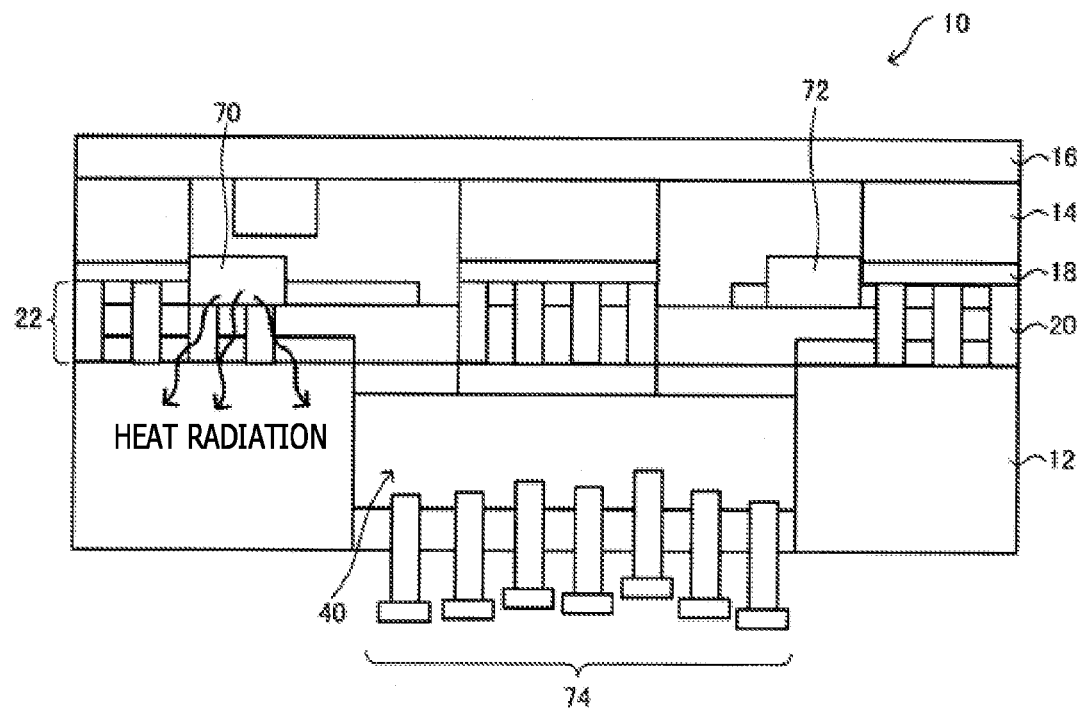
FIGS. 11A and 11B are views that illustrate an electronic apparatus case according to Example 2.
Figure 11B:
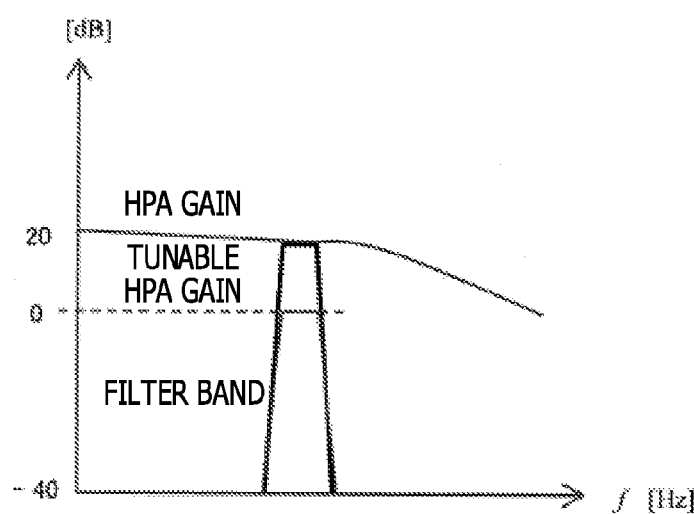

FIGS. 11A and 11B are views that illustrate an electronic apparatus case 10 according to this example. FIG. 11A is a cross-sectional view (corresponding to the cross-sectional view taken along line B-B' in FIG. 10A of the electronic apparatus case 10 in the case where a micro circuit is formed as the high power amplifier or the component thereof on the circuit board 22. In addition, FIG. 11B is a view that illustrates the relationship between gain characteristic of the high power amplifier and the filter band.

In the electronic apparatus case 10 according to this example, on the circuit board 22 in a space surrounded by the circuit board 22, the inner frame 14, and the lid 16, a micro circuit component 72 and a high power amplifier 70 are formed.

In the electronic apparatus case 10 according to this example, since it is possible to amplify a desired band while removing an unneeded wave by the filter 40, the high power amplifier 70 functions as a tunable high power amplifier as illustrated in FIG. 11B.

In addition, by the adjusting screw 74, as in Example 1, it is possible to adjust (shift) the band of the filter 40. Meanwhile, it is possible to use the adjusting screw 74 for radiating heat generated by a circuit formed on the circuit board 22, specifically, the high power amplifier 70.

In addition, in the electronic apparatus case 10 according to Example 2, the heat after passing through the circuit board 22 of the high power amplifier 70 directly contacts the lower case 12, and thereby the heat radiation effect is improved, and it is possible to facilitate a heat decrease.

In this manner, in the electronic apparatus case 10 according to the embodiment, the inside of the lower case 12 functions as the filter 40, and thereby it is possible to form a structure in which the circuit board 22 and the filter 40 are integrated. In addition, as described above, the electronic apparatus case 10 according to the embodiment is capable of suppressing a signal propagated through the circuit board 22 to reduce radio-frequency interference due to the interval between the circuit board 22 and the inner frame 14. For this reason, in the integrated structure of the circuit board 22 and the filter 40, a desired characteristic can be obtained.

Figure 12:
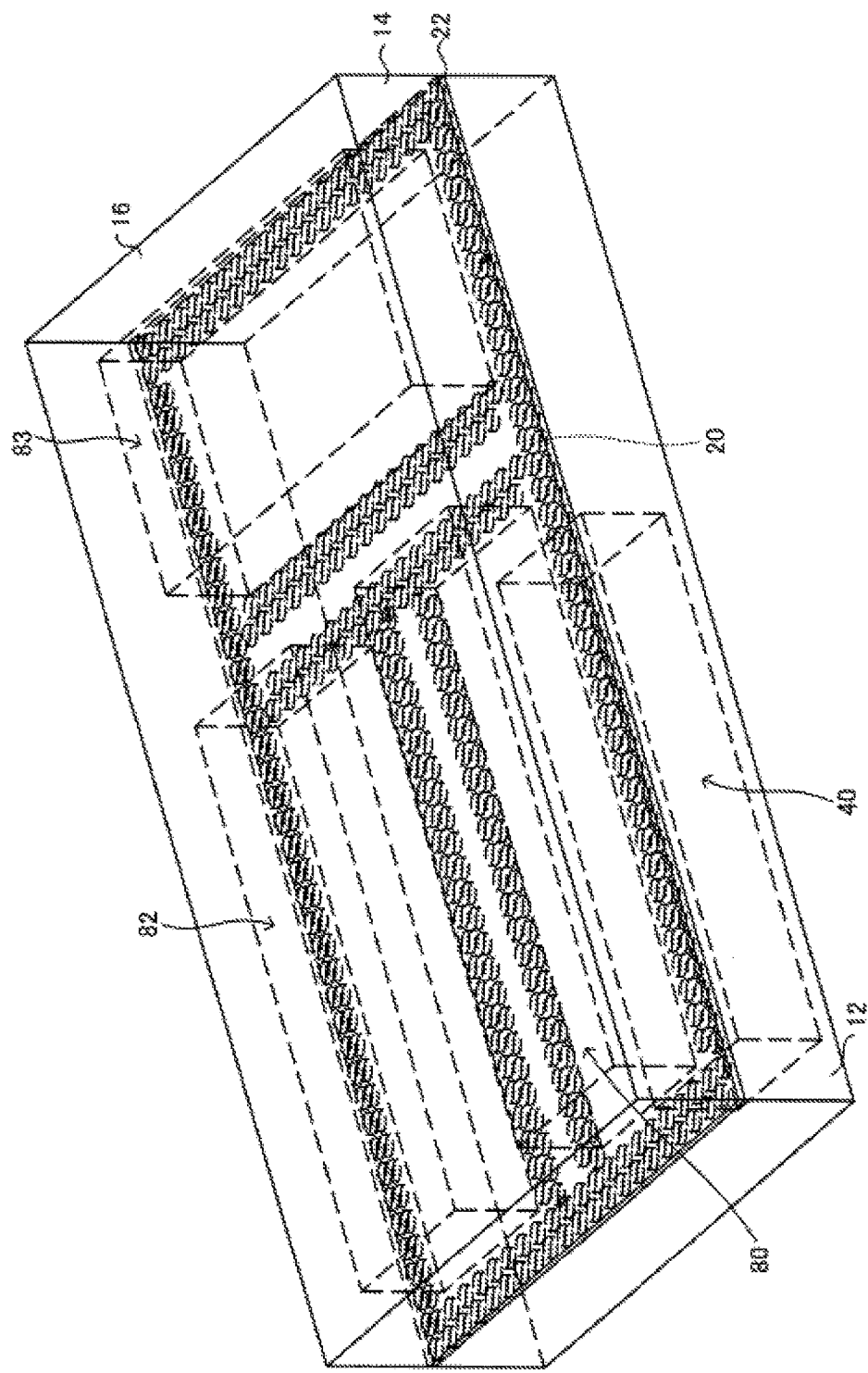
FIG. 12 is a perspective view that schematically illustrates the entire circuit board in a state where a plurality of circuits are formed inside and outside an area in which a filter is provided on the circuit board to which the electronic apparatus case according to the embodiment is applied.
Figure 13:
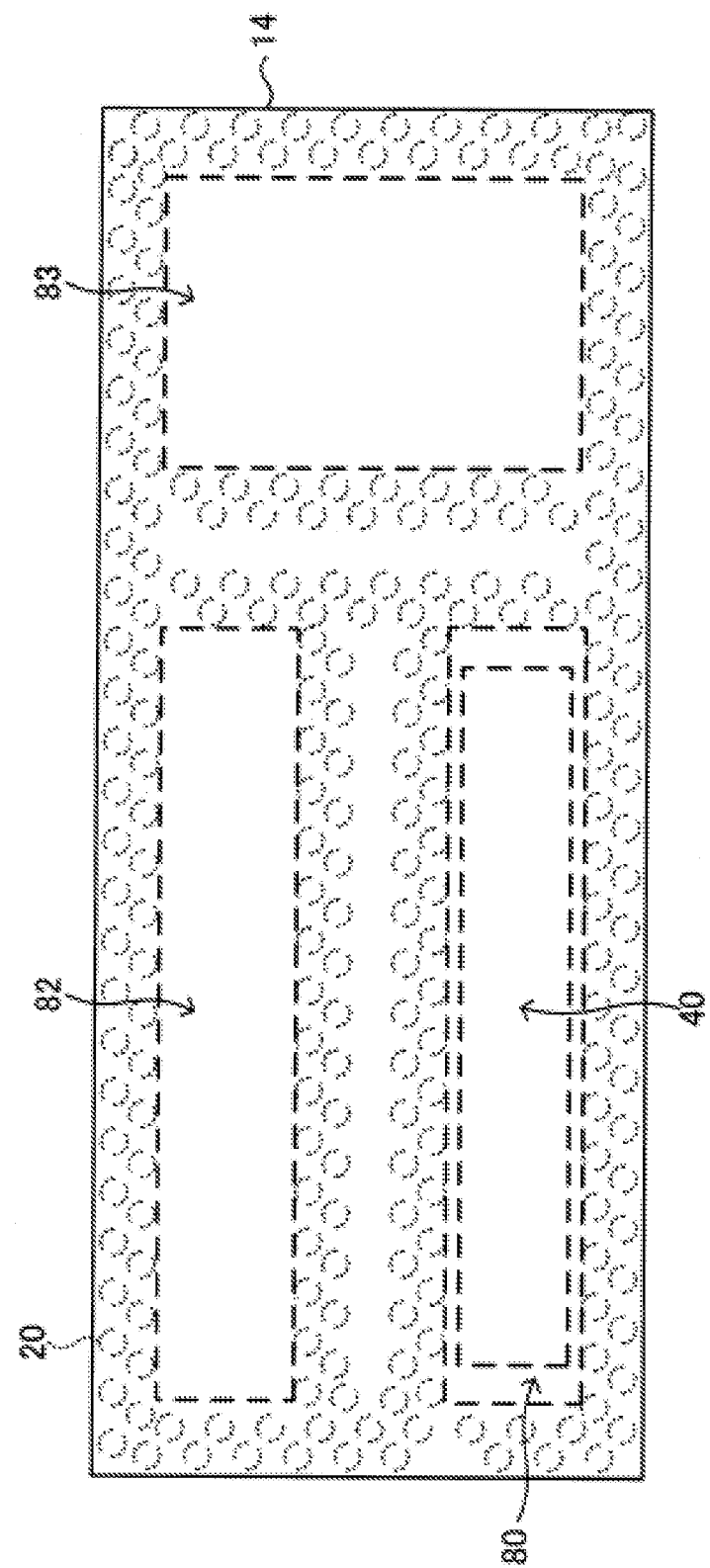
FIG. 13 is a plan view of the circuit board illustrated in FIG. 12 seen from a lid side.

Meanwhile, on the circuit board 22 of the electronic apparatus case 10 according to the embodiment, at the inside and outside of the area in which the filter 40 is provided, a circuit or the like that uses the transmission signal of the filter 40 may be formed. FIG. 12 is a perspective view that schematically illustrates the entire circuit board in a state where a plurality of circuits are formed inside and outside an area in which a filter 40 is provided on the circuit board 22 to which the electronic apparatus case 10 according to the embodiment is applied. Meanwhile, in FIG. 12, the inside configuration covered by the lower case 12, the inner frame 14, the lid 16, and the like is illustrated by a dotted line. In addition, FIG. 13 is a plan view of the circuit board illustrated in FIG. 12 seen from the lid 16 side. Furthermore, also in FIG. 13, the inside configuration covered by the lid 16 is illustrated by a dotted line.

On an area where the filter 40 is provided, an inner circuit 80 is provided. In addition, at the outside of the area where the filter 40 is provided, inner circuits 82 and 83 are provided. Moreover, the inner frame 14 is provided so as to surround each inner circuit. The through hole 20 is provided, as described above, inside the circuit board 22 at the lower portion of the inner frame 14.

As illustrated in FIGS. 12 and 13, in addition to the periphery of the filter 40 (inner circuit 80), the through holes 20 arranged as described above are provided so as to surround the periphery of the inner circuits 82 and 83. For this reason, according to the circuit illustrated in FIGS. 12 and 13, it is possible to suppress the propagation of the leak signal to each inner circuit (80, 82, and 83).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. An electronic apparatus case comprising:
a lower case;
a circuit board provided on the lower case, the circuit board having a plurality of signal lines in parallel, a specified area of the circuit board between each adjacent pair of the plurality of signal lines having a plurality of first through holes and a plurality of second through holes, the plurality of first through holes being arranged in a first line at a substantially equal interval of ⅛ or less of a wavelength of signals propagating in the plurality of signal lines, the plurality of second through holes being arranged in a second line at the substantially equal interval of ⅛ or less of the wavelength of signals propagating in the plurality of signal lines, the first line and the second line being arranged in parallel, a center of each of the plurality of first through holes and a center of each of the plurality of second through holes being shifted with a gap in a direction of the first line and the second line;
a lid provided over the circuit board so as to substantially entirely cover the circuit board; and
an inner frame provided between the circuit board and the lid; the inner frame, the circuit board and the lid forming a plurality of separated spaces that respectively surround the plurality of signal lines, wherein the gap in the direction of the first line and the second line is ½ of the interval of ⅛ or less of the wavelength of signals propagating in the plurality of signal lines.

2. The electronic apparatus case according to claim 1, wherein
each of the plurality of second through holes is arranged, in the direction of the first line and the second line, between adjacent pairs of the plurality of first through holes.

3. The electronic apparatus case according to claim 1, wherein
the plurality of first through holes and the plurality of second through holes are further arranged along a periphery of the circuit board.

4. The electronic apparatus case according to claim 1, wherein
each of the plurality of separated spaces forms a rectangle on the circuit board, and
a resonance frequency of the signals propagated in the plurality of signal lines is determined based on lengths of adjacent sides of each rectangle.

5. An electronic apparatus case comprising:
a lower case;
a circuit board provided on the lower case, the circuit board having a plurality of signal lines in parallel, each specified area of the circuit board between each adjacent pair of the plurality of signal lines having a plurality of first through holes and a plurality of second through holes, the plurality of first through holes being arranged in a first line at substantially equal interval of ⅛ or less of a wavelength of signals propagating in the plurality of signal lines, the plurality of second through holes being arranged in a second line at the substantially equal interval of ⅛ or less of the wavelength of signals propagating in the plurality of signal lines, the first line and the second line being arranged in parallel, each center of each of the plurality of first through holes and each center of each of the plurality of second through holes being shifted with a gap in a direction of the first line and the second line;
a lid provided over the circuit board so as to substantially entirely cover the circuit board; and
an inner frame provided between the circuit board and the lid, the inner frame and the circuit board and the lid forming a plurality of separated spaces that respectively surround the plurality of signal lines, wherein
a gasket is provided between the circuit board and the inner frame.

6. An electronic apparatus case comprising:
a lower case;
a circuit board provided on the lower case, the circuit board having a plurality of signal lines in parallel, each specified area of the circuit board between each adjacent pair of the plurality of signal lines having a plurality of first through holes and a plurality of second through holes, the plurality of first through holes being arranged in a first line at substantially equal interval of ⅛ or less of a wavelength of signals propagating in the plurality of signal lines, the plurality of second through holes being arranged in a second line at the substantially equal interval of ⅛ or less of the wavelength of signals propagating in the plurality of signal lines, the first line and the second line being arranged in parallel, each center of each of the plurality of first through holes and each center of each of the plurality of second through holes being shifted with a gap in a direction of the first line and the second line;
a lid provided over the circuit board so as to substantially entirely cover the circuit board; and
an inner frame provided between the circuit board and the lid, the inner frame and the circuit board and the lid forming a plurality of separated spaces that respectively surround the plurality of signal lines, wherein
the lower case is a filter including a cavity for each of the signals propagating in each of the plurality of signal lines.

7. The electronic apparatus case according to claim 6, wherein
a distance between the circuit board and the lid is adjustable, and
a height of the cavity is adjustable.

8. The electronic apparatus case according to claim 6, wherein
a bottom of the lower case forms stair shapes under a part to which each of the signals propagating within the cavity is inputted and a part from which each of the signals propagating within the cavity is outputted.

* * * * *